United States Patent
Li et al.

(10) Patent No.: US 10,879,277 B2
(45) Date of Patent: Dec. 29, 2020

(54) DISPLAY PANEL AND MANUFACTURING METHOD THEREOF AND DISPLAY DEVICE

(71) Applicant: Shenzhen China Star Optoelectronics Semiconductor Display Technology Co., Ltd., Guangdong (CN)

(72) Inventors: Wenying Li, Guangdong (CN); Xiaodi Liu, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 443 days.

(21) Appl. No.: 15/781,211

(22) PCT Filed: Jan. 4, 2018

(86) PCT No.: PCT/CN2018/071350
§ 371 (c)(1),
(2) Date: Jun. 4, 2018

(87) PCT Pub. No.: WO2019/041718
PCT Pub. Date: Mar. 7, 2019

(65) Prior Publication Data
US 2020/0303426 A1 Sep. 24, 2020

(30) Foreign Application Priority Data
Sep. 1, 2017 (CN) .......................... 2017 1 0780876

(51) Int. Cl.
*H01L 27/12* (2006.01)
*H01L 21/77* (2017.01)

(52) U.S. Cl.
CPC ...... *H01L 27/1244* (2013.01); *H01L 27/1288* (2013.01)

(58) Field of Classification Search
CPC ..................... H01L 27/1244; H01L 27/1288
See application file for complete search history.

(56) References Cited

U.S. PATENT DOCUMENTS

2011/0075089 A1   3/2011   Jheng
2012/0305911 A1*  12/2012  Iwasaka .............. H01L 27/1225
                                                       257/43

(Continued)

FOREIGN PATENT DOCUMENTS

CN   101246843 A   8/2008
CN   102799005 A   11/2012

*Primary Examiner* — Herve-Louis Y Assouman
(74) *Attorney, Agent, or Firm* — Leong C. Lei

(57) ABSTRACT

A display panel includes a first metal layer and a second metal layer sequentially stacked. The first metal layer includes a plurality of first metal lines and first gaps arranged between the first metal lines. The second metal layer includes a plurality of second metal lines arranged in a spaced manner. The second metal lines have an extension direction that is identical to an extension direction of the first metal lines. The second metal lines and the first metal lines are arranged to stagger, in position, with respect to each other. The second metal lines have orthogonal projections on the first metal layer that are located in areas of the first gaps in order to prevent shorting between the second metal lines in a process of manufacturing the second metal lines. A method for manufacturing the display panel and a display device are also provided.

13 Claims, 8 Drawing Sheets

(56) References Cited

U.S. PATENT DOCUMENTS

2012/0313905 A1* 12/2012 Kang .................... G02F 1/1345
                                                    345/204
2015/0187279 A1*  7/2015 Lee ......................... H01L 51/56
                                                    257/40
2015/0263043 A1*  9/2015 Chen .................... H01L 27/124
                                                    257/72

* cited by examiner

DISPLAY PANEL AND MANUFACTURING METHOD THEREOF AND DISPLAY DEVICE

CROSS REFERENCE TO RELATED APPLICATIONS

This application claims the priority of Chinese Patent Application No. 201710780876.6 filed on Sep. 1, 2017, titled "Display Panel and Manufacturing Method Thereof and Display Device", the disclosure of which is incorporated herein by reference in its entirety.

BACKGROUND OF THE INVENTION

1. Field of the Invention

The present invention relates to the field of electronic equipment, and more particularly to a display panel and a manufacturing method thereof, and a display device.

2. The Related Arts

With the consumers' increasing demands for finer resolution of display devices and increasing expansion of sizes of the display devices, as well as exacted pursuit for visual effects achievable with ultra slim bezels, the number of light emission drive devices involved in the display devices are continuously increased so that loading of data lines and drive scan lines is getting larger and larger. To reduce the loading of the data lines and the drive scan lines, wirings of fan-out zones of the display devices are formed with a double-layered metal line. Due to the design requirements for the ultra slim bezels, line width and line spacing of the wirings of the fan-out zones are made extremely small, and this, plus the need for reducing the loading of entirety of the data lines and drive scan lines, the two layers of the metal layer are often made relatively thick. Under such a condition of design requirement, it often causes irregularity of coating thickness of photoresist in a process of manufacturing stacked metal lines thereby leading to issues of incomplete exposure in certain areas and making shorting among stacked metal lines and consequently causing abnormality of performance of the display device.

SUMMARY OF THE INVENTION

In view of the above problem, an object of this application is to provide a display panel and a manufacturing method thereof and a display device that overcome the issue of shorting among stacked metal lines caused by irregular coating thickness of photoresist and incomplete exposure in a process of manufacturing the stacked metal lines.

In order to overcome the deficiencies existing in the background art, this application provides a display panel, which comprises a first metal layer and a second metal layer that are arranged to sequentially stack on each other, wherein the first metal layer comprises a plurality of first metal lines and first gaps arranged between the first metal lines; the second metal layer comprising a plurality of second metal lines arranged in a spaced manner, the second metal lines having an extension direction that is identical to an extension direction of the first metal lines, positions of the second metal lines and the first metal lines being alternately arranged, the second metal lines having orthogonal projections on the first metal layer that are located in areas of the first gaps so as to prevent shorting between the second metal lines in a process of manufacturing the second metal lines.

In the above, positions of the first metal lines are shifted in a first direction relative to positions of the second metal lines, and the first direction and the extension direction of the first metal lines are mutually perpendicular.

In the above, the display panel further comprises an insulation layer, wherein the insulation layer is stacked between the first metal layer and the second metal layer, the insulation layer covering the first metal lines and filled up in the first gaps.

In the above, the second metal lines are arranged on the insulation layer such that the orthogonal projections of the second metal lines on the first metal layer each have a portion located in an area of one of the first metal lines and another portion located in the area of the first gap that is adjacent to the area of the first metal line.

In the above, the second metal lines are arranged on the insulation layer such that the orthogonal projections of the second metal lines on the first metal layer each have a portion located in an area of one of the first metal lines, another portion covering the first gap that is adjacent to area of the first metal line, and a further portion located in an area of another one of the first metal lines that is adjacent to the area of the first metal line.

In the above, the second metal lines are arranged on the insulation layer such that the orthogonal projections of the second metal lines on the first metal layer are each located in an area between the first metal line and an adjacent one of the first metal lines.

This application also provides a method for manufacturing a display panel, which comprises:
forming a first metal layer on a base plate, where the first metal layer comprises a plurality of first metal lines and first gaps arranged between the first metal lines;
forming an insulation layer on the first metal layer; and
forming a second metal layer on the insulation layer, wherein the second metal layer comprises a plurality of second metal lines arranged in a spaced manner, the second metal lines having an extension direction that is identical to an extension direction of the first metal lines, positions of the second metal lines and the first metal lines being alternately arranged, the second metal lines having orthogonal projections on the first metal layer that are located in areas of the first gaps.

In the above method, a first layer of conductive metal is deposited on the base plate; photoresist is coated on the first layer of conductive metal; and a first mask plate is arranged on a first position to form, through exposure and development, the first metal lines.

In the above method, a second layer of conductive metal is deposited on the base plate; photoresist is coated on the second layer of conductive metal; a second mask plate is arranged on a second position to form, through exposure and development, the second metal lines, wherein the first position is shifted relative to the second position in a direction perpendicular to the extension direction of the first metal lines.

This application also provides a display device, which comprises a display panel, and the display panel comprises a first metal layer and a second metal layer that are arranged to sequentially stack on each other, wherein the first metal layer comprises a plurality of first metal lines and first gaps arranged between the first metal lines; the second metal layer comprising a plurality of second metal lines arranged in a spaced manner, the second metal lines having an extension direction that is identical to an extension direction of the first metal lines, positions of the second metal lines and the first metal lines being alternately arranged, the second metal lines having orthogonal projections on the first metal layer that are located in areas of the first gaps so as to prevent shorting between the second metal lines in a process of manufacturing the second metal lines.

In the above device, positions of the first metal lines are shifted in a first direction relative to positions of the second metal lines, and the first direction and the extension direction of the first metal lines are mutually perpendicular.

In the above device, the display panel further comprises an insulation layer, the insulation layer being stacked between the first metal layer and the second metal layer, the insulation layer covering the first metal lines and filled up in the first gaps.

In the above device, the second metal lines are arranged on the insulation layer such that the orthogonal projections of the second metal lines on the first metal layer each have a portion located in an area of one of the first metal lines and another portion located in the area of the first gap that is adjacent to the area of the first metal line.

In the above device, the second metal lines are arranged on the insulation layer such that the orthogonal projections of the second metal lines on the first metal layer each have a portion located in an area of one of the first metal lines, another portion covering the first gap that is adjacent to area of the first metal line, and a further portion located in an area of another one of the first metal lines that is adjacent to the area of the first metal line.

In the above device, the second metal lines are arranged on the insulation layer such that the orthogonal projections of the second metal lines on the first metal layer are each located in an area between the first metal line and an adjacent one of the first metal lines.

This application provides a display a panel and a manufacturing method of the display panel, in which a second mask plate is away from the first mask plate by a predetermined distance horizontally in a process of manufacturing second metal lines to make the second metal lines shifted in the horizontal direction by a predetermined distance with respect to the first metal lines in order to reduce the shorting issues between the second metal lines caused by incomplete exposure of the photoresist due to the photoresist being hard to get level through flowing in a process of manufacturing the second metal lines resulting from the first metal lines being relatively thick.

BRIEF DESCRIPTION OF THE DRAWINGS

To more clearly explain the technical solution proposed in embodiments of this application, a brief description of the drawings that are necessary for describing the embodiments will be given below. It is obvious that the drawings that will be described below show only some embodiments of this application. For those having ordinary skills of the art, other drawings may be readily available from these attached drawings without the expense of creative effort and endeavor.

DETAILED DESCRIPTION OF THE PREFERRED EMBODIMENTS

A clear and complete description will be given to technical solutions provided in the embodiments of this application with reference to the attached drawings of the embodiments of this application.

Figure 1:
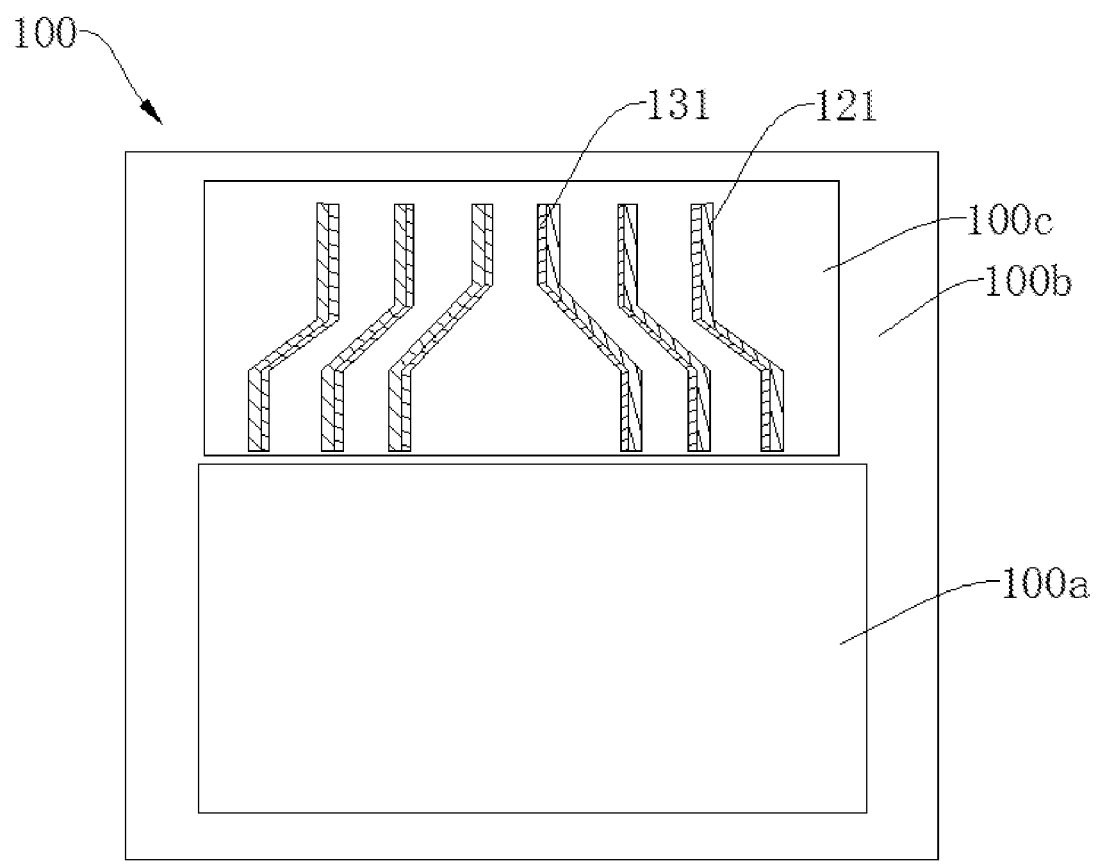
FIG. 1 is a schematic view illustrating a structure of a display panel provided in embodiments of this application.
Figure 2:
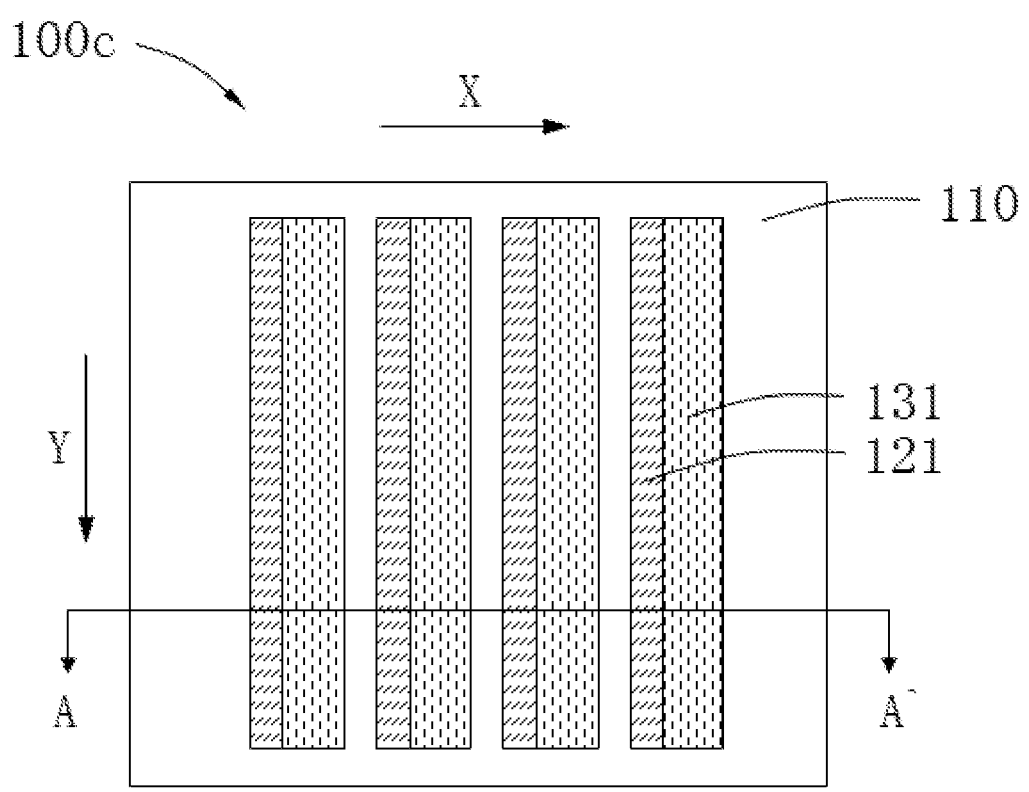
FIG. 2 is a schematic view illustrating a structure of a fan-out zone of the display panel provided in FIG. 1.

Referring to FIGS. 1 and 2, FIG. 1 shows a display panel 100 provided in embodiments of this application. The display panel 100 comprises a display area 100a and a non-display area 100b. The non-display area 100b comprises a fan-out zone 100c. The fan-out zone 100c is provided with metal wires, such as data lines, for connection with drive chips. To reduce the electrical resistance of the metal wires and to reduce a width of the non-display area, the metal wires are arranged in upper and lower layers and are connected in parallel to reduce the electrical resistance thereof.

In the instant embodiment, referring to FIG. 2, the fan-out zone 100c comprises a base plate 110, a first metal layer 120, and a second metal layer 130 that are stacked in sequence. The first metal layer 120 comprises a plurality of first metal lines 121 an first gaps 122 arranged between the first metal lines 121; the second metal layer 130 comprises a plurality of second metal lines 131 that are arranged in a spaced manner. The first metal lines 121 have an extension direction Y that is identical to an extension direction of the second metal lines 131. The positions of the second metal lines 131 and the first metal lines 121 are alternately arranged. The second metal lines 131 have an orthogonal projection on the first metal layer 120 that fall in areas of the first gaps 122. Specifically, the orthogonal projections of the second metal lines 131 on the first metal layer 120 may be completely located in or completely covering or partly located in the areas of the first gaps 122 to prevent shorting between adjacent ones of the second metal lines 131 during a process of manufacturing the second metal lines 131.

Figure 3:
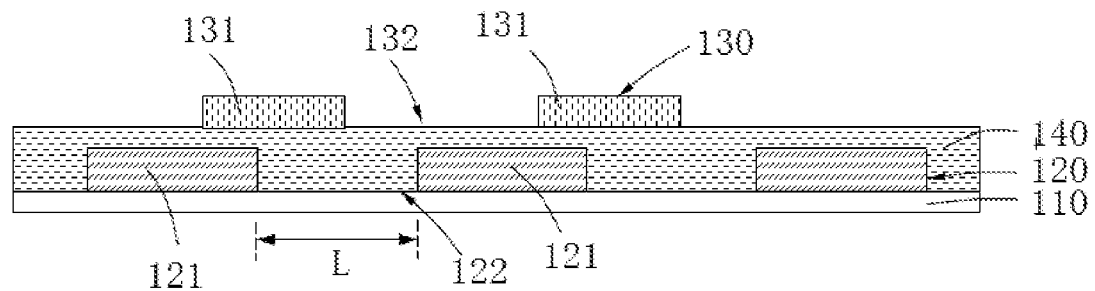
FIG. 3 is a cross-sectional view taken in direction AK of FIG. 1.

In the instant embodiment, referring to FIG. 3, FIG. 3 is a cross-sectional view taken in direction AK of FIG. 1. The display panel further comprises an insulation layer 140. The insulation layer 140 is stacked between the first metal layer 120 and the second metal layer 130 to prevent shorting connection between the first metal lines 121 and the second metal lines 131. The insulation layer 140 covers the first metal lines 121 and fills up in the first gaps 122. The second metal layer 130 comprises second gaps 132 arranged between the second metal lines 131. In a process of manufacturing the second metal lines 131, the second metal lines 131 are formed in areas of the second metal layer 130 that are exactly opposite to a mask plate 170; and the second gaps 132 are formed in areas of the second metal layer 130 that are not opposite to the mask plate 170.

Figure 4:
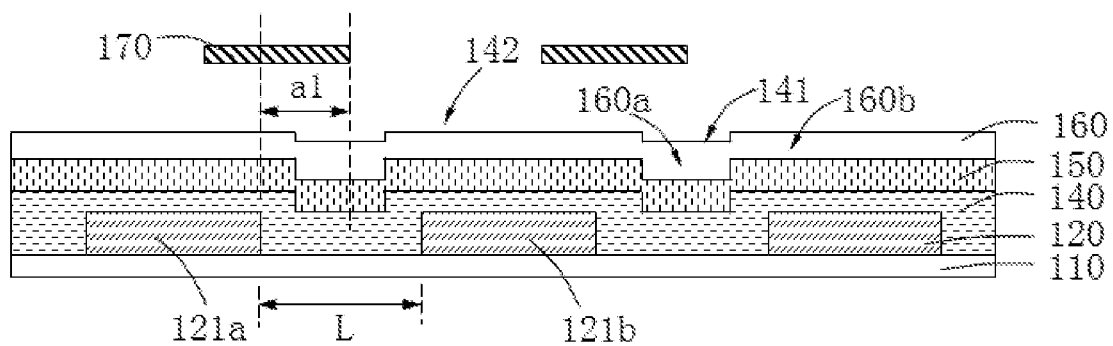
FIG. 4 is a schematic view illustrating manufacturing of a second metal line provided in a first example embodiment of this application.

Specifically, referring to FIG. 4, when the display panel adopts a slim bezel design, it is common to reduce the number of the metal wires in each layer by adopting a stacked arrangement of the metal wires of the fan-out zone (the non-display area), such as data lines and scan lines, and in addition, thicknesses of the metal wires are increased to ensure that the metal wires can carry an increased load. In a process of manufacturing the second metal lines 131 with photolithography, a metal layer 150 is deposited on the insulation layer 140, and photoresist 160 is coated on the metal layer 150. Since the thickness of the first metal lines 121 is increased, the photoresist 160 is formed with recesses 141 at locations corresponding to areas between the first metal lines 121 in a direction toward the base plate 110 and also bumps 142 at locations corresponding to areas corresponding to the first metal lines 121 in a direction toward the second metal layer 130. After the photoresist 160 has been coated, the photoresist 160 forms a photoresist portion 160*a* having a relatively large thickness in each of the recesses 141 and a photoresist portion 160*b* having a relatively small thickness on each of the bumps 142. Under such a condition, in the prior art, the second metal lines 131 are formed exactly on the first metal lines 121 and thus, arranging the mask plate 170 exactly above the first metal lines 121 would requires etching off the relatively thick photoresist portions 160*a* deposited in the recesses 141. However, since the photoresist portions 160*a* are relatively thick, the photoresist portions 160*a* are readily susceptible to incomplete exposure, leading to portions of the metal layer 150 located under the photoresist portions 160*a* being not completely etched off and causing residual metal left between the second metal lines 131 to thereby readily lead to shorting between the second metal lines 131 and eventually causing issues of bad display panel products.

In the instant embodiment, the first metal lines 121 are set at locations that are shifted in a first direction X from locations of the second metal lines 131, wherein the first direction X intersects the extension direction Y of the first metal lines 121. Preferably, the first direction X and the extension direction Y of the first metal lines 121 are mutually perpendicular. Such a structural arrangement allows, in a process of manufacturing the second metal lines 131 with photolithography, the second metal lines 131 to be formed at locations that are shifted away from positions of being exactly above the first metal lines 121, meaning the second metal lines 131 are formed at the locations of the recesses 141, so that with the mask plate 170 arranged on the recesses 141, it only needs to etch off the relatively thin photoresist portion 160*b* at the bumps 142 and there is no need to etch the relatively thick photoresist portions 160*a* at the recesses 141, whereby incomplete exposure of the photoresist portions 160*a* that leads to shorting of may the second metal lines 131 be avoided.

This application provides no specific limitation to a shifting amount of the second metal lines 131 being shifted away from the first metal lines 121. Preferable conditions may be illustrated with the following example embodiments.

First Example Embodiment

Figure 5:
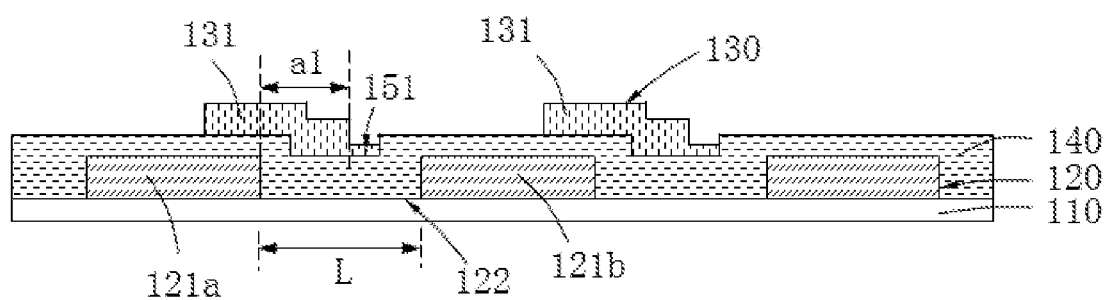
FIG. 5 is a schematic view illustrating a structure of a display panel provided in the first example embodiment of this application.

Referring to FIGS. 4 and 5, the second metal lines 131 are arranged on the insulation layer 140 such that the second metal lines 131 have orthogonal projections on the first metal layer 120 each of which has a portion in an area of the first metal line 121*a* and another portion located in an area of a first gap 122 that is adjacent to a first metal line 121*b*. A spacing distance between the first metal lines 121*a*, 121*b* is designated by L. In a process of manufacturing the second metal lines 131, the mask plate 170 is shifted in the X direction away from a position of being exactly opposite to the first metal lines 121 by an amount of a1, where a1 is smaller than L. After operations of coating the photoresist 160 on the metal layer 150, aligning the mask plate 170, and carrying out photolithography, the second metal lines 131 as shown in FIG. 4 are formed. At this moment, although a part of the relatively thick photoresist portion 160*a* in the recess 141 may not be completely removed and a part of the metal 151 is left, since the photoresist portion 160*b* that is adjacent to the bump 142 has been completely exposed, namely metal at the site of the bump 142 being completely removed, it will not cause shorting between the second metal lines 131. This application takes advantage of arranging the second metal lines 131 and the first metal lines 121 to shift away from each other so as to reduce the shorting issue between the second metal lines 131 resulting from incomplete exposure of the photoresist 160 in a process of manufacturing the second metal lines 131.

Second Example Embodiment

Figure 6:
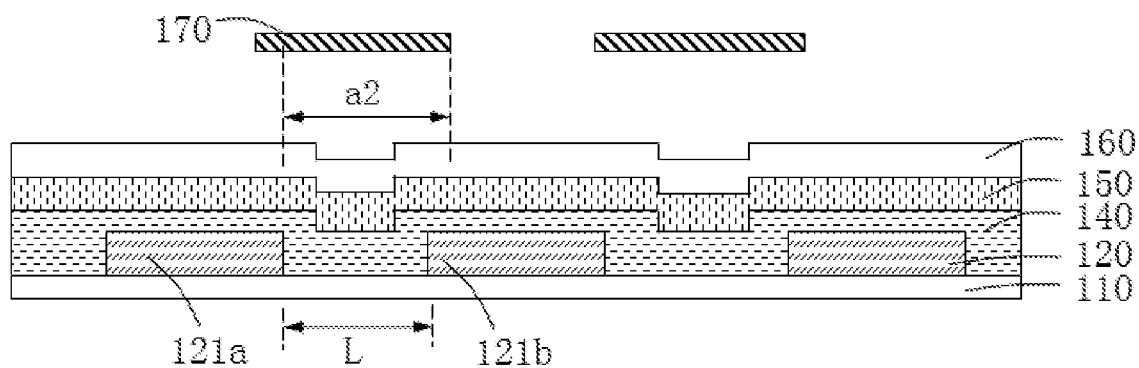
FIG. 6 is a schematic view illustrating manufacturing of a second metal line provided in a second example embodiment of this application.
Figure 7:
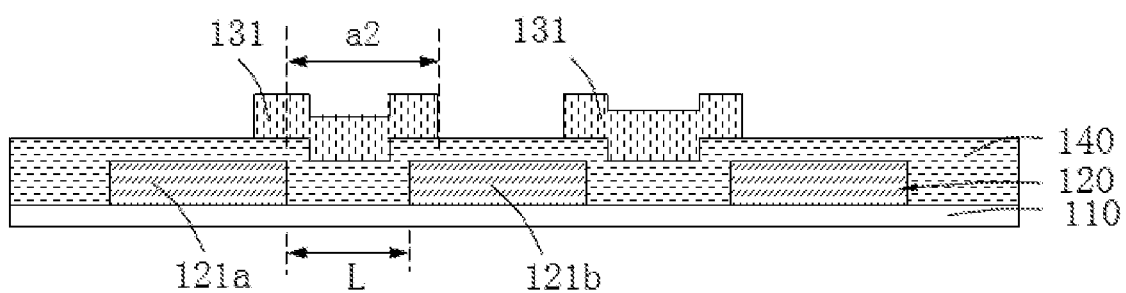
FIG. 7 is a schematic view illustrating a structure of a display panel provided in the second example embodiment of this application.

Referring to FIGS. 6 and 7, second metal lines 131 are arranged on the insulation layer 140 and an orthogonal projection of each of the second metal lines 131 on the first metal layer 120 has a portion that is located in an area of the first metal line 121*a*, another portion that covers the first gap 122 that is adjacent to the first metal line 121*a*, and a further portion that is located in an area of the first metal line 121*b* that is adjacent to the first metal line 121*a*. A spacing distance between the first metal lines 121*a*, 121*b* is designated by L. In a process of manufacturing the second metal lines 13, the mask plate 170 is shifted in the X direction away from a position of being exactly opposite to the first metal lines 121 by an amount of a2, where a2 is greater than L, and a width of the second metal line 131 is greater than the spacing distance between the first metal lines 121*a*, 121*b*. In the instant embodiment, the second metal line 131 spans, in a width direction thereof, across the first gap 122, and preferably, a central axis of the second metal line 131 is collinear with a central axis of the first gap 122, namely two adjacent second metal lines 131 are symmetric with respect to the first metal line 121 that is arranged between the two second metal lines 131. After operations of coating the photoresist 160 on the second metal layer 130, aligning the mask plate 170, and carrying out photolithography, the second metal lines 131 shown in FIG. 6 are formed. The photoresist portions 160 at the bumps 142 are relatively thin and can be easily and completely exposed so that no residual metal is left between the second metal lines 131 and no shorting between the second metal lines 131 may be caused. This application takes advantage of arranging the second metal lines 131 and the first metal lines 121 to shift away from each other so as to reduce the shorting issue between the second metal lines 131 resulting from incomplete exposure of the photoresist 160 in a process of manufacturing the second metal lines 131.

Third Example Embodiment

Figure 8:
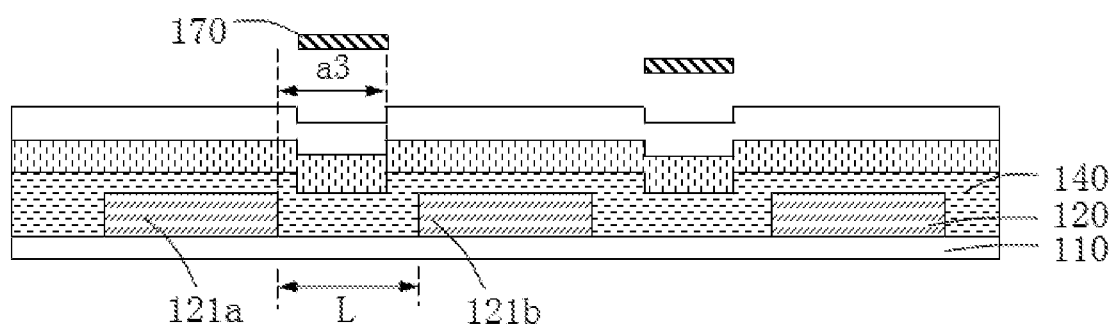
FIG. 8 is a schematic view illustrating manufacturing of a second metal line provided in a third example embodiment of this application.
Figure 9:
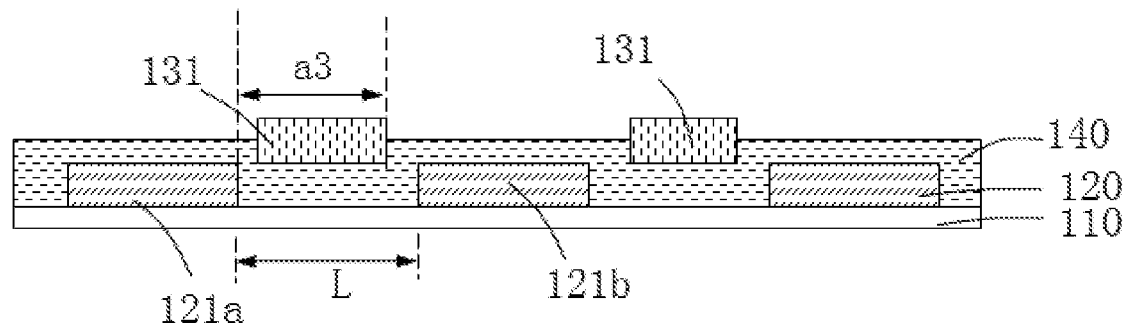
FIG. 9 is a schematic view illustrating a structure of a display panel provided in the third example embodiment of this application.

Referring to FIGS. 8 and 9, the second metal lines 131 are arranged on the insulation layer 140 such that the second metal lines 131 have orthogonal projections on the first metal layer 120 each of which is located in an area between the first metal line 121a and the adjacent first metal line 121b. A spacing distance between the first metal lines 121a, 121b is designated by L. In a process of manufacturing the second metal lines 131, the mask plate 170 is shifted in the X direction away from a position of being exactly opposite to the first metal lines 121 by an amount of a3, where a3 is smaller than L, and a width of the second metal line 131 is smaller than the spacing distance between the first metal lines 121a, 121b, namely the orthogonal projection of the second metal lines 131 on the first metal layer 120 is located in area of the first gap 122. Preferably, a central axis of the second metal line 131 is collinear with a central axis of the first gap 122, namely two adjacent second metal lines are symmetric with respect to the first metal line that is arranged between the two second metal lines. After operations of coating the photoresist 160 on the second metal layer 130, aligning the mask plate 170, and carrying out photolithography, the second metal lines 131 shown in FIG. 8 are formed. The photoresist portions 160 at the bumps 142 are relatively thin and can be easily and completely exposed so that no residual metal is left between the second metal lines 131 and no shorting between the second metal lines 131 may be caused. This application takes advantage of arranging the second metal lines 131 and the first metal lines 121 to shift away from each other so as to reduce the shorting issue between the second metal lines 131 resulting from incomplete exposure of the photoresist 160 in a process of manufacturing the second metal lines 131.

Fourth Example Embodiment

Figure 10:
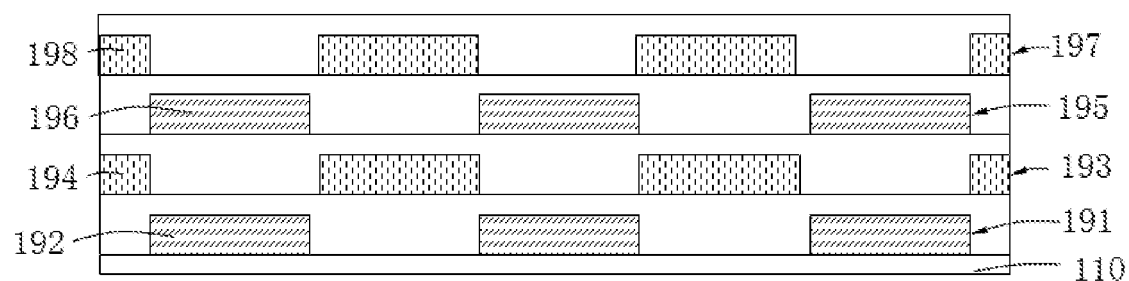
FIG. 10 is a schematic view illustrating a structure of a display panel provided in a fourth example embodiment of this application.

Referring to FIG. 10, the display panel may further comprise multiple metal layer 191, 193, 195, 197, and insulation layers arranged between the multiple metal layers. In the multiple metal layers, metal lines 192, 194, 196, 198 of adjacent ones of the metal layer 191, 193, 195, 197 are arranged to shift away from each other in a horizontal direction. The arrangement of the metal lines 192, 194, 196, 198 of the metal layers can be such that the metal lines 192, 194 of the adjacent metal layers 191, 193 are staggered with respect to each other and the metal lines 192, 196 of the metal layers 191, 195 that are spaced from each other are exactly opposite to each other. The arrangement of the metal lines of these layers can be made in other ways and this application provides no specific limitation thereto. This application makes the metal lines of metal layers that are adjacent to each other shifted away from each other in the horizontal direction to overcome the shorting issues between the metal lines resulting from incomplete exposure of the photoresist 160 in manufacturing metal lines of multiple layers stacked on each other.

Figure 11:
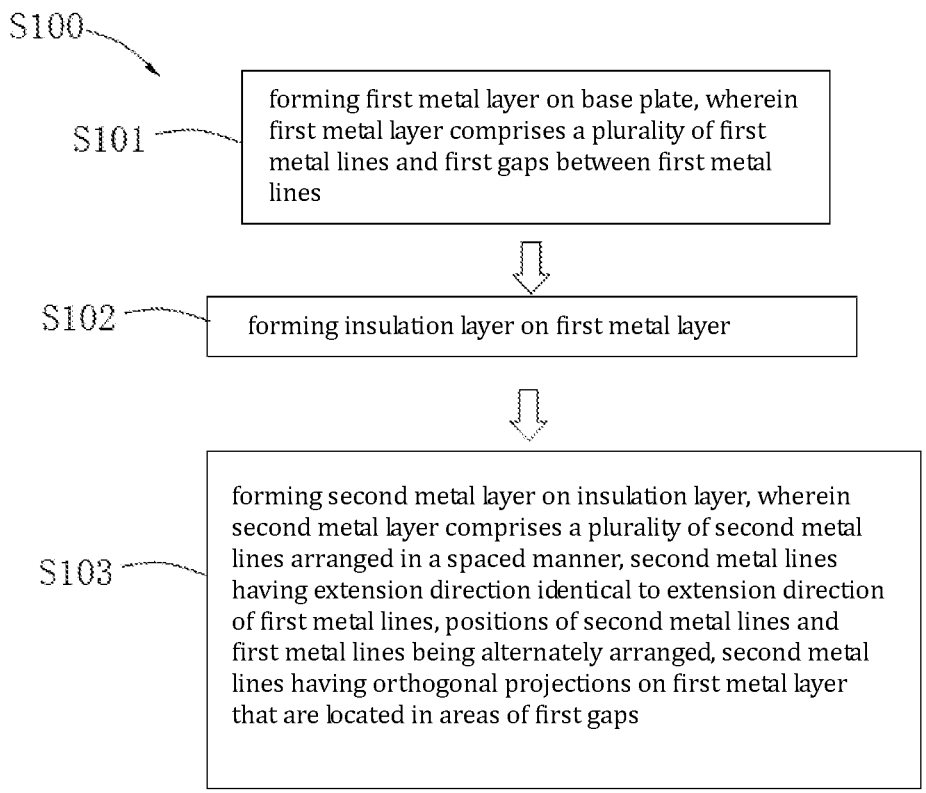
FIG. 11 is a flow chart illustrating a display panel manufacturing method provided in the embodiments of this application.
Figure 12:
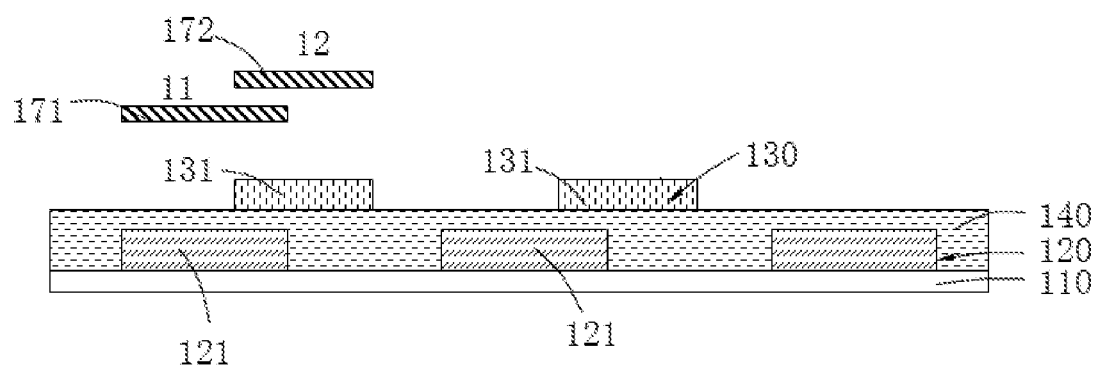
FIG. 12 is a schematic view illustrating manufacturing of a display panel provided in the embodiments of this application.

Referring to FIGS. 11 and 12, this application also provides a method S100 for manufacturing a display panel, which comprises:

S101, forming a first metal layer 120 on a base plate 110, wherein the first metal layer 120 comprises a plurality of first metal lines 121 and first gaps 122 arranged between the first metal lines 121.

Specifically, a first conductive metal layer, such as MO/AL/Mo, is first deposited on a glass base plate 110. After the first conductive metal layer has been formed on the base plate 110, photoresist 160 is coated on the first conductive metal layer, and a first mask plate 171 is set at a first position 11, so as to form first metal lines 121 after operations of exposure and development.

S102, forming an insulation layer 140 on the first metal layer 120. For example, a layer of SiNx, is deposited.

S103, forming a second metal layer 130 on the insulation layer 140. The second metal layer 130 comprises a plurality of second metal lines 131 that are arranged in a spaced manner and an extension direction of the second metal lines 131 is identical to an extension direction of the first metal lines 121, and the second metal lines 131 and the first metal lines 121 are alternately arranged such that the second metal lines 131 have orthogonal projections on the first metal layer 120 that are located in areas of the first gaps 122.

Specifically, a second conductive metal layer, such as Mo/AL/Mo, is deposited on the insulation layer 140. After photoresist 160 has been coated on the second conductive metal layer, a second mask plate 172 is set at a second position 12, so as to form second metal lines 131 after operations of exposure and development, wherein the first position 11 is shifted away from the second position 12 in direction perpendicular to the extension direction of the first metal lines 121. The first mask plate 171 may be of the same structure as that of the second mask plate 172.

Since the first metal lines 121 are of an increased thickness, the photoresist 160 coated on the second conductive metal layer may not easily get level through flowing so that a portion of the photoresist 160 may get thickened in a recessed area. In a process of exposure for the second metal lines 131, the thickened portion of the photoresist 160 is readily susceptible to incomplete exposure, leading to remaining of an unexpected pattern, such as a metal line, and this causes shorting or potential risk of shorting between two adjacent ones of the second metal lines 131 and eventually causing abnormality of displaying of the display panel.

The instant embodiment takes advantage of shifting a second mask plate 172 away from the first mask plate 171 by a predetermined distance horizontally in a process of manufacturing the second metal lines 131 to make the second metal lines 131 shifted in the horizontal direction by a predetermined distance with respect to the first metal lines 121 in order to reduce the shorting issues between the second metal lines 131 caused by incomplete exposure of the photoresist 160 due to the photoresist 160 being hard to get level through flowing in a process of manufacturing the second metal lines 131 resulting from the first metal lines 121 being relatively thick.

This application also provides a display device, which comprises a display panel of any of the embodiments described above.

Embodiments of this application take advantage of shifting second metal lines 131 and first metal lines 121 away from each other by a predetermined among in a horizontal direction in manufacturing multiple stacked layers of metal lines, wherein a first position 11 of a mask plate and a second position 12 of a mask plate are not coincident so that in a process of manufacturing the second metal lines 131, areas of photoresist 160 having a relatively small thickness are exposed areas, while areas of the photoresist 160 having a relatively large thickness are shielding areas. In this way the exposure of the photoresist 160 is made complete, without leaving metal residues in the exposed areas, thereby well resolving the shorting issues between the second metal lines 131 to meet the needs of design requirements for high specification display devices of large size, high resolution, high refresh rate, and ultra slim bezel.

In summary, although the above disclosure provides the preferred embodiments of this application, the preferred embodiments are not intended to limit this application. For those having ordinary skills in the art, various changes and modifications are available without departing from the sprit and scope of this application. Thus, the scope of protection of this application is only determined by the appended claims.

What is claimed is:

1. A display panel, comprising a first metal layer and a second metal layer that are arranged to sequentially stack on each other, wherein the first metal layer comprises a plurality of first metal lines and first gaps arranged between the first metal lines; the second metal layer comprising a plurality of second metal lines arranged in a spaced manner, the second metal lines having an extension direction that is identical to an extension direction of the first metal lines, positions of the second metal lines and the first metal lines being alternately arranged, the second metal lines having orthogonal projections on the first metal layer that are located in areas of the first gaps so as to prevent shorting between the second metal lines in a process of manufacturing the second metal lines, wherein an insulation layer is stacked between the first metal layer and the second metal layer and the insulation layer covers the first metal lines and fills up the first gaps of the first metal layer such that a top surface of the insulation layer comprises recessed parts and raised parts that respectively correspond, in location, to the first gaps and the first metal lines and are alternate with each other, the second metal lines being respectively located in the recessed parts, wherein a residual portion of the second metal layer is located in at least one of the recessed parts and is connected with the second metal line located in the at least one of the recessed parts; and the residual part of the second metal layer is separated from an adjacent one of the second metal lines by a space formed atop one of the raised parts adjacent to the at least one of the recessed parts so that the residual part of the second metal layer is prevented from shorting with the adjacent one of the second metal lines.

2. The display panel according to claim 1, wherein positions of the first metal lines are shifted in a first direction relative to positions of the second metal lines, and the first direction and the extension direction of the first metal lines are mutually perpendicular.

3. The display panel according to claim 1, wherein the second metal lines are arranged on the insulation layer such that the orthogonal projections of the second metal lines on the first metal layer each have a portion located in an area of one of the first metal lines and another portion located in the area of the first gap that is adjacent to the area of the first metal line.

4. The display panel according to claim 1, wherein the second metal lines are arranged on the insulation layer such that the orthogonal projections of the second metal lines on the first metal layer each have a portion located in an area of one of the first metal lines, another portion covering the first gap that is adjacent to area of the first metal line, and a further portion located in an area of another one of the first metal lines that is adjacent to the area of the first metal line.

5. The display panel according to claim 1, wherein the second metal lines are arranged on the insulation layer such that the orthogonal projections of the second metal lines on the first metal layer are each located in an area between the first metal line and an adjacent one of the first metal lines.

6. A method for manufacturing a display panel, comprising:

forming a first metal layer on a base plate, where the first metal layer comprises a plurality of first metal lines and first gaps arranged between the first metal lines;
forming an insulation layer on the first metal layer; and
forming a second metal layer on the insulation layer, wherein the second metal layer comprises a plurality of second metal lines arranged in a spaced manner, the second metal lines having an extension direction that is identical to an extension direction of the first metal lines, the second metal lines and the first metal lines being alternately arranged the second metal lines having orthogonal projections on the first metal layer that are located in areas of the first gaps,
wherein the insulation layer is stacked between the first metal layer and the second metal layer and the insulation layer covers the first metal lines and fills up the first gaps of the first metal layer such that a top surface of the insulation layer comprises recessed parts and raised parts that respectively correspond, in location, to the first gaps and the first metal lines and are alternate with each other, the second metal lines being respectively located in the recessed parts, wherein a residual portion of the second metal layer is located in at least one of the recessed parts and is connected with the second metal line located in the at least one of the recessed parts; and the residual part of the second metal layer is separated from an adjacent one of the second metal lines by a space formed atop one of the raised parts adjacent to the at least one of the recessed parts so that the residual part of the second metal layer is prevented from shorting with the adjacent one of the second metal lines.

7. The method for manufacturing a display panel according to claim 6, wherein a first layer of conductive metal is deposited on the base plate; photoresist is coated on the first layer of conductive metal; and a first mask plate is arranged on a first position to form, through exposure and development, the first metal lines.

8. The method for manufacturing a display panel according to claim 7, wherein a second layer of conductive metal is deposited on the base plate; photoresist is coated on the second layer of conductive metal; a second mask plate is arranged on a second position to form, through exposure and development, the second metal lines, wherein the first position is shifted relative to the second position in a direction perpendicular to the extension direction of the first metal lines.

9. A display device, comprising display panel, the display panel comprising a first metal layer and a second metal layer that are arranged to sequentially stack on each other, wherein the first metal layer comprises a plurality of first metal lines and first gaps arranged between the first metal lines; the second metal layer comprising a plurality of second metal lines arranged in a spaced manner, the second metal lines having an extension direction that is identical to an extension direction of the first metal lines, positions of the second metal lines and the first metal lines being alternately arranged, the second metal lines having orthogonal projections on the first metal layer that are located in areas of the first gaps so as to prevent shorting between the second metal lines in a process of manufacturing the second metal lines, wherein an insulation layer is stacked between the first metal layer and the second metal layer and the insulation layer covers the first metal lines and fills up the first gaps of the first metal layer such that a top surface of the insulation layer comprises recessed parts and raised parts that respectively correspond, in location, to the first gaps and the first metal lines and are alternate with each other, the second metal lines being respectively located in the recessed parts, wherein a residual portion of the second metal layer is located in at least one of the recessed parts and is connected with the second metal line located in the at least one of the recessed parts; and the residual part of the second metal layer is separated from an adjacent one of the second metal lines by a space formed atop one of the raised parts adjacent to the at least one of the recessed parts so that the residual part of the second metal layer is prevented from shorting with the adjacent one of the second metal lines.

10. The display device according to claim 9, wherein positions of the first metal lines are shifted in a first direction relative to positions of the second metal lines, and the first direction and the extension direction of the first metal lines are mutually perpendicular.

11. The display panel according to claim 9, wherein the second metal lines are arranged on the insulation layer such that the orthogonal projections of the second metal lines on the first metal layer each have a portion located in an area of one of the first metal lines and another portion located in the area of the first gap that is adjacent to the area of the first metal line.

12. The display panel according to claim 9, wherein the second metal lines are arranged on the insulation layer such that the orthogonal projections of the second metal lines on the first metal layer each have a portion located in an area of one of the first metal lines, another portion covering the first gap that is adjacent to area of the first metal line, and a further portion located in an area of another one of the first metal lines that is adjacent to the area of the first metal line.

13. The display panel according to claim 9, wherein the second metal lines are arranged on the insulation layer such that the orthogonal projections of the second metal lines on the first metal layer are each located in an area between the first metal line and an adjacent one of the first metal lines.

* * * * *